(12) United States Patent
Poechmueller

(10) Patent No.: US 7,373,562 B2
(45) Date of Patent: May 13, 2008

(54) MEMORY CIRCUIT COMPRISING REDUNDANT MEMORY AREAS

(75) Inventor: Peter Poechmueller, Dresden (DE)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 11/145,256

(22) Filed: Jun. 3, 2005

(65) Prior Publication Data

US 2005/0281076 A1   Dec. 22, 2005

(30) Foreign Application Priority Data

Jun. 4, 2004   (DE) ............... 10 2004 027 423

(51) Int. Cl.
*G11C 29/00* (2006.01)

(52) U.S. Cl. .............. 714/710; 714/723; 365/201

(58) Field of Classification Search .............. None
See application file for complete search history.

(56) References Cited

U.S. PATENT DOCUMENTS

| 5,579,265 | A | 11/1996 | Devin |
| 5,668,818 | A | 9/1997 | Bennett et al. |
| 6,304,499 | B1 | 10/2001 | Pöchmüller |
| 6,992,937 | B2 * | 1/2006 | Tran et al. ............... 365/200 |
| 2002/0191454 | A1 | 12/2002 | Beer et al. |
| 2004/0246792 | A1 | 12/2004 | Beer |

FOREIGN PATENT DOCUMENTS

| DE | 695 00 007 T2 | 12/1996 |
| DE | 199 54 346 A1 | 5/2001 |
| DE | 199 47 041 C2 | 11/2001 |
| DE | 101 26 301 A1 | 12/2002 |
| DE | 103 18 771 A1 | 11/2004 |

OTHER PUBLICATIONS

German Patent Office Examination Report dated Feb. 3, 2005.

* cited by examiner

*Primary Examiner*—Christine T Tu
(74) *Attorney, Agent, or Firm*—Patterson & Sheridan, L.L.P.

(57) ABSTRACT

The invention relates to a memory circuit comprising regular memory areas and redundant memory areas, redundancy circuits in each case being assigned to the redundant memory areas, each redundancy circuit having permanently settable storage elements in order, in a first setting state, to address the assigned redundant memory area in the event of addressing of the regular memory area with a memory address determined by the first setting state, each redundancy circuit, in a second setting state, addressing the assigned redundant memory area in a manner dependent on an activation signal.

21 Claims, 3 Drawing Sheets

Legend:
21, 22 - REDUNDANCY CIRCUIT
27 - ERROR CORRECTION CIRCUIT

MEMORY CIRCUIT COMPRISING REDUNDANT MEMORY AREAS

CROSS-REFERENCE TO RELATED APPLICATIONS

This application claims foreign priority benefits under 35 U.S.C. § 119 to co-pending German patent application number DE 10 2004 027 423.1, filed 4 Jun. 2004. This related patent application is herein incorporated by reference in its entirety.

BACKGROUND OF THE INVENTION

1. Field of the Invention

The invention relates to a memory circuit comprising a regular memory area and a redundant memory area, and to a method for repairing a memory circuit comprising redundant memory areas.

2. Description of the Related Art

High-capacity memory circuits are difficult to produce without any errors. After the production of the memory circuits, single cell errors or errors in memory areas typically occur, which are corrected by a subsequent repair step. The repair step provides for the defective memory areas or the memory areas with a defective single cell to be replaced by a corresponding redundant memory area, so that when the address of the defective memory area is present, the redundant memory area is addressed instead of the regular addressed memory area.

Memory circuits that have been produced and repaired in this way are then usually combined to form modules and tested again. When the memory circuits are combined to form modules, one or more errors may occur in one or more of the memory circuits of the modules on account of cell degradation effects. Since such a memory module is constructed from a relatively large number of memory circuits, e.g. 36, the probability of such a single cell error occurring in a memory module is rather high, thereby greatly reducing the yield in the production of memory modules.

Some manufacturers of memory modules provide electrical fuses in order to repair single cell errors after the construction of the memory module. This is carried out for example by providing individual registers in the logics sections situated in the memory circuit. These registers may be provided so as to replace individually defective memory cells. This is carried out by the programming of electrical fuses with the aid of electric currents after the module has been constructed. The error address is set in the electrical fuses in this case. This has the disadvantage that additional chip area is required in order to accommodate additional logic circuits and register circuits. Moreover, the registers themselves may be defective and then furthermore have to be repaired.

Furthermore, single cell errors appearing after the construction of the memory module can be repaired by further redundant memory areas in the memory cell array. This can be performed by selection of the further redundant memory areas by means of electrical fuses. In other words, when an address set by the electrical fuses is present, a further redundant memory area is addressed instead of the memory area with the defective single cell. This has the disadvantage that additional redundant memory areas have to be provided which are used only in the case when a single cell error occurs after the assembly of the memory module. These require additional chip area and thus increase the costs of producing the memory circuits.

SUMMARY OF THE INVENTION

It is an object of the present invention to provide a memory circuit which makes it possible to repair errors occurring after the assembly of memory modules in memory areas in a simple manner without requiring a large additional chip area. It is furthermore an object of the present invention to provide a method for repairing a memory circuit.

A first aspect of the present invention provides a memory circuit comprising a regular memory area and a redundant memory area. A redundancy circuit is assigned to the redundant memory area, which redundancy circuit has permanently settable storage elements in order, in a first setting state, to address the assigned redundant memory area in the event of addressing of the regular memory area with a memory address determined by the first setting state. According to the invention, the redundancy circuit is configured in such a way that, in a second setting state of the permanently settable storage elements, it addresses the redundant memory area in a manner dependent on an activation signal.

The memory circuit according to the invention has the advantage that, after the repair of the memory circuit, e.g. in a front-end repair method, by setting the permanently settable storage elements, which are designed for example as laser fuses, e.g. in a laser trimming process, a further repair step can be effected which uses the unused redundant memory areas for repairing single cell errors that have occurred after the assembly of the memory circuits in a memory module. This is carried out by establishing a first and a second setting state in the redundancy circuit, in which case, depending on a second setting state, the respectively assigned redundant memory area can be addressed with an activation signal.

In accordance with one embodiment of the invention, the permanently settable storage elements of each of the redundancy circuits may comprise a permanently settable activation storage element. The first setting state of one of the redundancy circuits is determined by at least the activation storage element being in a first setting state.

As an alternative, the second setting state may be determined by the activation storage element being in a second setting state.

In accordance with a further embodiment of the invention, it is possible for the permanently settable storage elements of each of the redundancy circuits in each case to comprise a correction storage element, the second setting state being determined by a setting state of the correction storage element.

In accordance with one embodiment of the present invention, an error correction circuit is provided, which comprises further permanently settable storage elements for setting a further memory address, in order to generate the activation signal in a manner dependent on the presence of the further memory address. In particular, the error correction circuit may be connected to a plurality of redundancy circuits for a plurality of redundant memory areas in order to make the activation signal available to the plurality of redundancy circuits. In this way, the error correction circuit can be used to repair an error occurring after the incorporation of the memory circuit in a single cell or in a memory area with the aid of the error correction circuit. For this purpose, the address of the memory area to be repaired is coded in the further permanently settable storage elements, so that the activation signal is output when this address is present in such a way that at least one of the connected redundancy circuits addresses the assigned redundant memory area.

Furthermore, it is thereby possible for redundant memory areas not used previously in the repair step during the method for fabricating the memory circuits to be used for the repair of errors that occur subsequently.

Preferably, at least one of the permanently settable storage elements and/or of the further permanently settable storage elements is formed with a fuse storage element. In this case, at least the permanently settable storage elements are formed with a laser fuse storage element and one of the further permanently settable storage elements is formed with an e-fuse storage element (an electronic fuse that is electrically programmable). This has the advantage that errors occurring during the method for producing the memory circuit can be repaired with the aid of a laser trimming process in which laser fuses are or are not severed in accordance with a predefinition, while the repair of errors that occur after the completion of the memory circuits is carried out by a process of electrically programming one or more e-fuses since the memory circuits are generally packaged in a housing and are thus no longer accessible for a laser trimming process.

A further aspect of the present invention provides a method for repairing a memory circuit comprising regular memory areas and redundant memory areas. A group of permanently settable storage elements is assigned to each of the redundant memory areas. A first repair step is provided, in which the storage elements of one of the groups are set in such a way that the assigned redundant memory area is addressed instead of one of the regular memory areas at a memory address determined by the first setting state. A second repair step is provided, in which further permanently settable storage elements are set in such a way that one of the remaining groups—not set in the first repair step—of adjustable storage elements is addressed in a manner dependent on the presence of a further memory address to be repaired.

The method according to the invention has the advantage that, in the memory circuit, all redundant memory areas for repairing defective memory areas are already available during the production of the memory circuit. In the event of a further error occurring after the completion of the memory circuit, the unused redundant memory areas can then be used to repair the error that has subsequently occurred. A provision of additional redundant memory areas that are provided only for the case of subsequently occurring errors is thereby superfluous.

In accordance with one embodiment of the invention, the first repair step comprises a laser trimming process for blowing the permanently settable storage elements designed as laser fuses, and the second repair step comprises a programming of further permanently settable storage elements designed as e-fuse elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
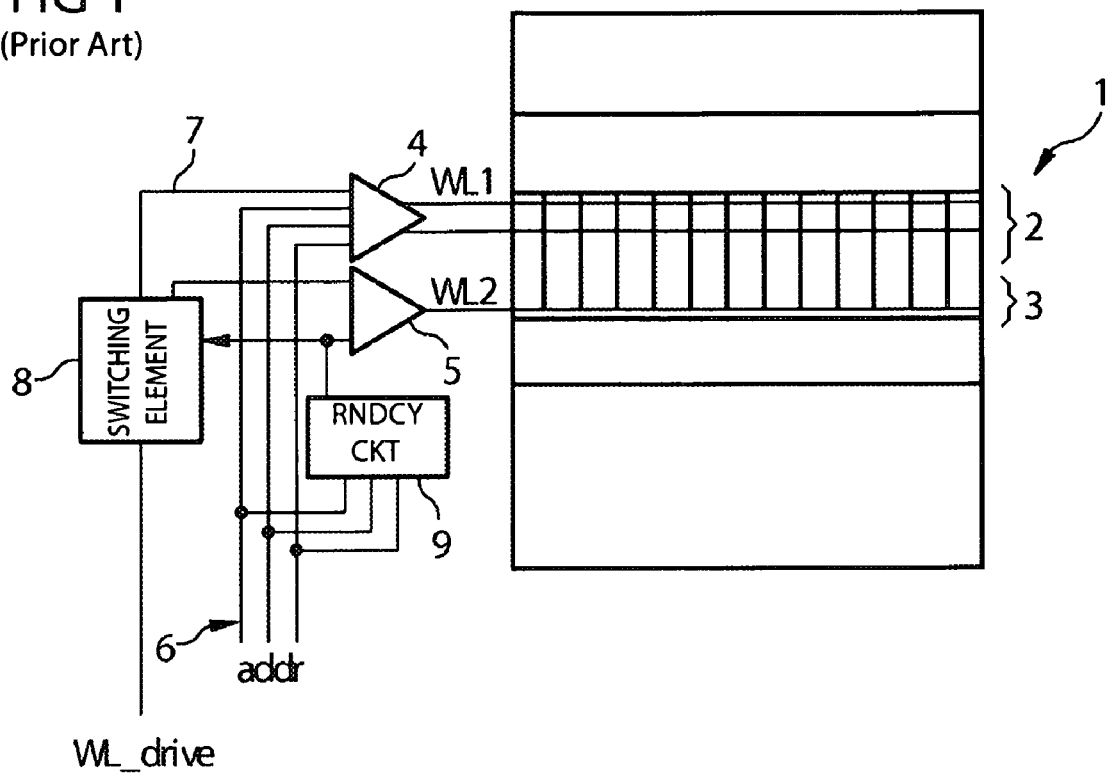
FIG. 1 shows a schematic illustration of a detail from a memory circuit in accordance with the prior art.

FIG. 1 shows a detail from a conventional memory circuit having a memory cell array 1 having regular memory areas 2 and redundant memory areas 3. The regular memory areas 2 can be addressed via regular word lines WL1, only one of which is shown for the sake of better illustration. The redundant memory areas 3 can correspondingly be addressed via redundant word lines WL2, likewise only one of which is shown. For the sake of better clarity of the illustrations, bit lines as are likewise present for the addressing of the memory cells, which run essentially perpendicular to the word line WL in order to form a matrix, are not illustrated. The regular word lines WL1 are connected to a first word line driver 4, so that corresponding drive signals can be driven on the regular word lines WL1 by the first word line driver 4. Equally, a second word line driver 5 is provided in order to drive addressing signals onto the redundant word lines WL2.

The first word line driver 4 is connected to address lines 6 in order to select one of the regular word lines WL1 depending on a memory address present. Furthermore, the first word line driver 4 is connected to a word line activation line 7, via which a word line activation signal WL_drive can be applied. The word line activation line 7 has a switching element 8, which enables the word line activation signal WL_drive to be applied or not applied to the first word line driver 4.

The second word line driver 5 is connected to a redundancy circuit 9, the redundant word line 2 being activated or not being activated, depending on the redundancy circuit. The redundancy circuit 9 is likewise coupled to the address lines 6, so that the second word line driver 5 activates the redundant word line in a manner dependent on an address set in the redundancy circuit and, for all remaining addresses, the redundant word line WL2 is not activated. For this purpose, the redundancy circuit 9 is connected to the switching element 8 in order, in the event of an activation of one of the redundant word lines WL2, to switch the switching element 8 in such a way that the word line activation signal is not applied to the first word line driver 4 and, consequently, the first word line driver 4 activates none of the regular word lines WL1 if the redundant word line WL2 is addressed under the control of the redundancy circuit 9. If the switching element 8 is switched in such a way that the word line activation signal is not applied to the first word line driver 4, the word line activation signal WL_drive is applied to the second word line driver 5.

Figure 2:
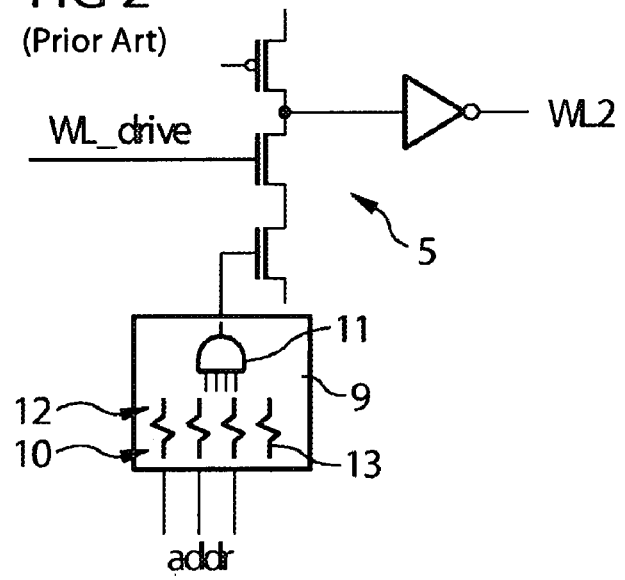
FIG. 2 shows a redundancy circuit for addressing a redundant memory area instead of a regular memory area in accordance with the prior art.

FIG. 2 illustrates a detail from the schematic illustration of FIG. 1, which illustrates more extensively the redundancy circuit 9 and the second word line driver 5. The redundancy circuit essentially comprises an AND gate, which is coupled to fuse storage elements 10 at its inputs in such a way that when a memory address set in the fuse storage devices 10 is present on the address lines 6, a logic "1" is present at the output of the AND gate. In this case, the fuse storage elements 10 operate or do not operate, depending on the information stored, as an inverter for the respective address bit present, so that a predefined memory address can be coded in such a way that when the predefined memory address is present, all inputs of the AND gate 11 assume a logic "1" and thus bring about a logic "1" at the output of the AND gate 11.

The AND gate 11 of the redundancy circuit 9 outputs as output signal a redundancy signal which, on the one hand, has the effect that the switching element 8 diverts the word line activation signal to the second word line driver 5 (not shown), and, on the other hand, ensures that, in the event of activation by the word line activation signal, the second word line driver 5 outputs a logic "1" onto the redundant word line in order to activate the redundant memory area. The fuse storage elements 10 comprise address fuse elements 12 in order to set the predetermined address and an activation fuse element 13 in order to specify, depending on its setting state, whether the address set in the address fuse elements 12 is valid or not, i.e. is to be used or not.

Figure 3:
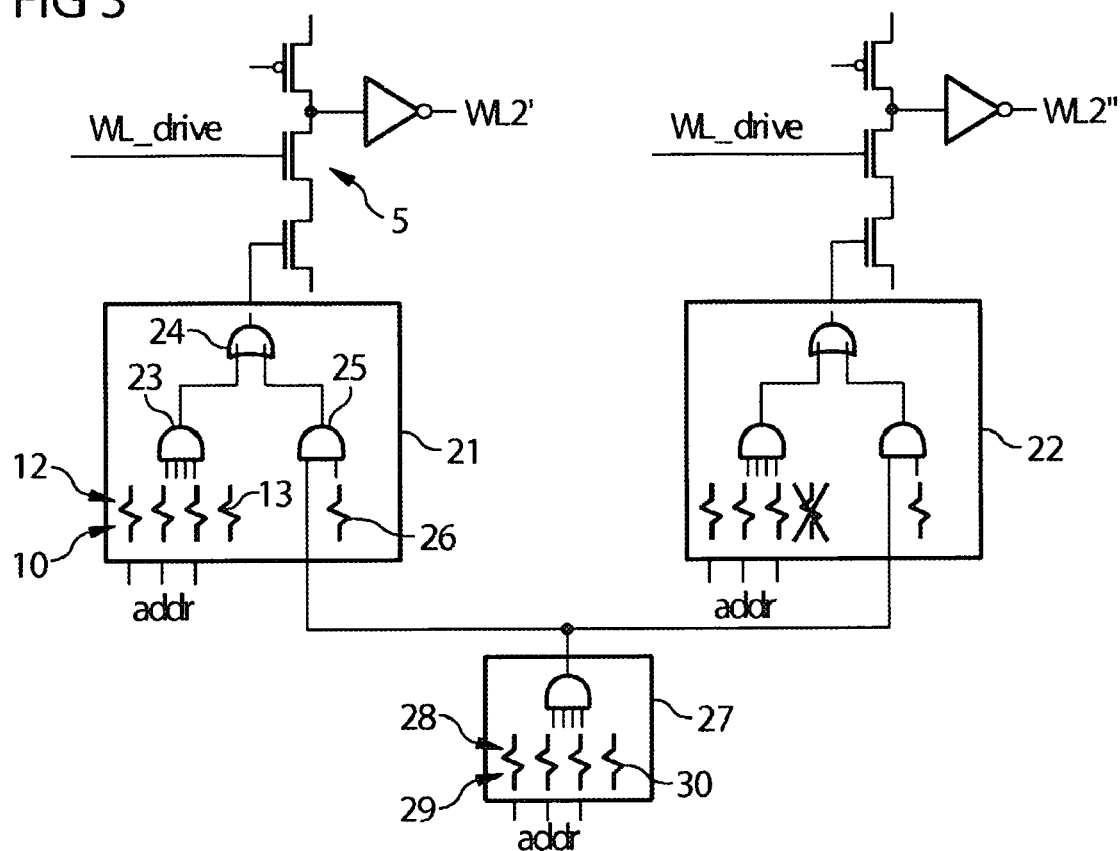
FIG. 3 shows a memory circuit according to the invention in accordance with a first embodiment of the invention.

FIG. 3 illustrates a schematic illustration of a detail from a memory circuit according to the invention. It shows a first redundancy circuit 21 and a second redundancy circuit 22, which are respectively coupled via a second word line driver 5 to a first redundant word line WL2' and a second redundant word line WL2" in such a way that the first redundant word line WL2' or the second redundant word line WL2" is activated depending on the output signal of the first or second redundancy circuit, respectively. The first and the second redundancy circuit 21, 22 are constructed essentially identically. They serve for replacing the defective memory area by a redundant memory area when an error occurs in the memory cell array 1. The error is established in a test method in a front-end test process and, depending on the repair solution determined therefrom, settings are performed in the redundancy circuits 21, 22. For this purpose, the redundancy circuits 21, 22 provide the fuse storage elements 10 comprising the address fuse elements 12 and the activation fuse element 13.

The fuse storage elements 10 are preferably designed as laser fuses which are set in a laser trimming process in an unhoused state of the integrated memory circuit. During the laser trimming process, a laser beam cuts through a formerly existing connecting line at a defined position by means of fusing, so that the connecting line is separated. The use of such laser fuses is advantageous since the latter can be realized in a simple manner and with a comparatively small area outlay in the integrated memory circuit.

The fuse elements 10 are connected to inputs of an AND gate 23, in such a way that when the address set is present in the address fuse elements 12 and when the activation fuse element 13 is severed, a logic "1" is present at each of the inputs of the AND gate 23 and, consequently, a logic "1" is likewise present at the output of the AND gate 23 and is passed to an input of an OR gate 24. The OR gate 24 outputs a logic "1" at its output if a logic "1" is present at the first input. The respective redundant word line WL2 can thereby be activated.

The redundancy circuit 21, 22 furthermore has a further AND gate 25, which is connected to an error correction fuse element 26 by a first input and to an error correction circuit 27 by a second input. An output of the further AND gate 25 is connected to a second input of the OR gate 24. Consequently, the respective redundant word line WL2 is activated if either the address set in the address fuse elements 12 is present on the address lines 6 and the activation fuse element 13 is severed or if a logic "1" is present at the output of the further AND gate 25. This is the case if the correction fuse element 26 is set correspondingly, i.e. is severed, and a logic "1" is thus present at the first input of the further AND gate 25 if an activation signal is applied to the second input of the further AND gate 25 by the error correction circuit 27.

The activation signal is generated by the error correction circuit 27, which has electrical fuse elements 28 in order to code an applied address in such a way that an activation signal with a logic "1" is generated in the event of the memory address being applied. The electrical fuse elements 28 have electrical fuse elements 29 and a further activation fuse element 30. In contrast to laser fuses, electrical fuse elements 28 are programmed by applying an electric programming current, so that the free accessibility of the chip area, as required in a laser trimming process, is not necessary.

In the exemplary embodiment illustrated in FIG. 3, the error correction circuit 27 is connected to two redundancy circuits 21, 22. However, the number of connected redundancy circuits is not limited to two and any desired number of redundancy circuits may be connected to the error correction circuit 27. The correction fuse element 26 is likewise designed as a laser fuse element. For repair, the laser fuse element is selected in such a way that a redundancy circuit not required in the front-end repair step is selected from all redundancy circuits connected to an error correction circuit 27, which redundancy circuit is selected for a subsequent repair step that may have to be provided after the completion of the memory circuit. As an alternative, the correction fuse element 26 may also be designed as an electrical fuse element in order to program the selection of the redundancy circuit not required during the front-end repair step essentially at the same time as the programming of the electrical fuse elements 28 of the error correction circuit 27.

It may likewise be provided that the activation signal is passed to the memory circuit via an external terminal and the error correction circuit 27 is essentially situated outside the memory circuit to be repaired.

Figure 4:
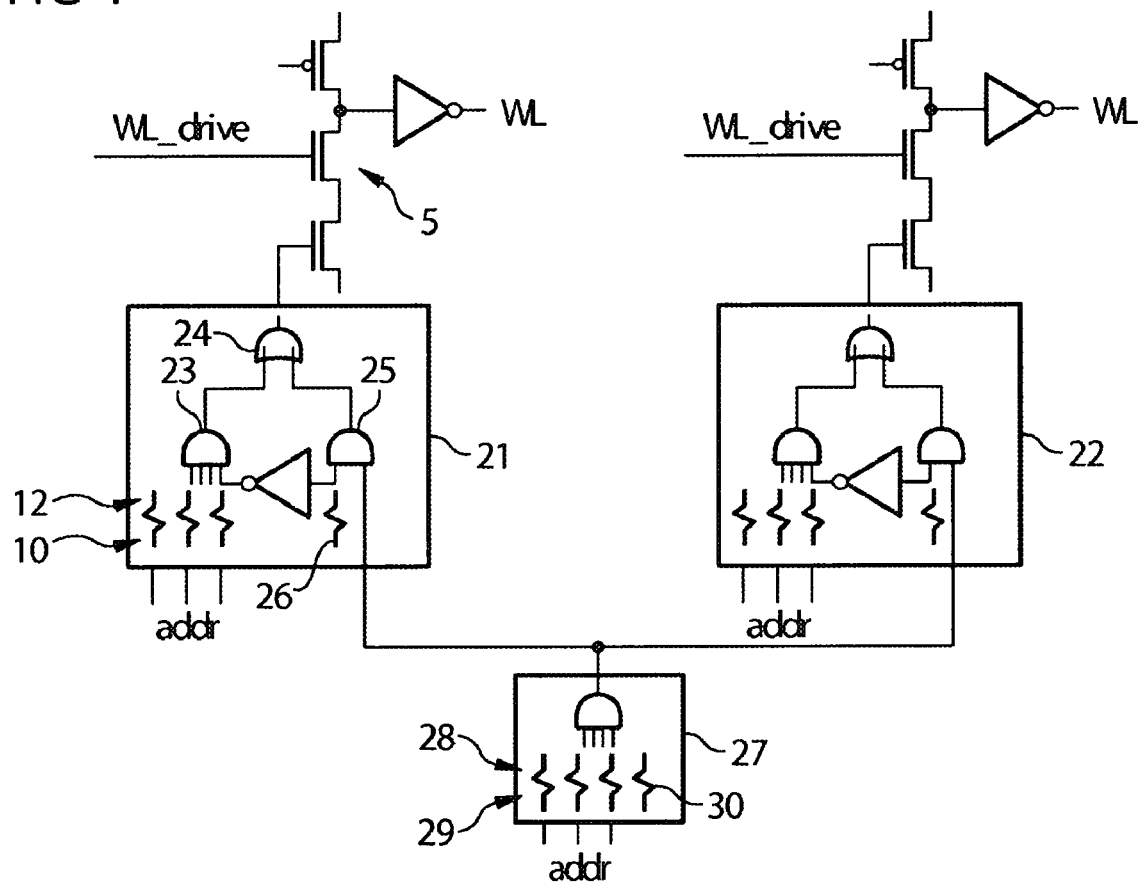
FIG. 4 shows a memory circuit according to the invention in accordance with a further embodiment of the invention.

FIG. 4 illustrates a further embodiment of the present invention. Identical reference symbols essentially correspond to the same elements as in the embodiment of FIG. 3. The embodiment of FIG. 4 makes it possible to omit the activation fuse element 13 of the redundancy circuits 21, 22 and instead to couple the corresponding input of the AND gate 23 to the correction fuse element 26 via an inverter. If the correction fuse element is in a first unchanged state, a logic "0" is present at the first input of the further AND gate and a logic "1" is present at the corresponding input of the AND gate 23, whereby the coding of the address fuse elements 12 is effective.

If the correction fuse element 26 is in a second state, a logic "1" is present at the first input of the further AND gate 25 and a logic "0" is thus present at the corresponding input of the AND gate 23, whereby a logic "0" is always present at the output of the AND gate 23, so that the applied address can never activate the assigned redundant word line WL2. The redundancy circuit is thus available, however, for a repair through the predefinition of the activation signal that can be generated by the error correction circuit 27.

While the foregoing is directed to embodiments of the present invention, other and further embodiments of the invention may be devised without departing from the basic scope thereof, and the scope thereof is determined by the claims that follow.

What is claimed is:
1. A memory device, comprising:
   a plurality of regular memory areas;
   a plurality of redundant memory areas;
   a plurality of redundancy circuits, each having a plurality of first settable elements and configured to activate a corresponding redundant memory area to replace a failing regular memory area in response to,
  a) detecting an address for the failing regular memory area stored in the first settable elements when a second settable element is in a first state, or
  b) an activation signal when the second settable element is in a second state; and
an error correction circuit having a plurality of third settable elements and configured to, in response to detecting an address for a failing regular memory area stored in the third settable elements, generate the activation signal to cause one of the plurality of redundancy circuits whose second settable element is in the second state to activate a corresponding redundant memory area.

2. The device of claim 1, wherein the first settable elements comprise laser fuses.

3. The device of claim 1, wherein the second settable element comprises an electrically programmable fuse.

4. The device of claim 1, wherein the second settable element and the third settable elements comprise electrically programmable fuses.

5. A memory device, comprising:
  a plurality of regular memory areas;
  a plurality of redundant memory areas;
  a plurality of redundancy circuits configured to activate a corresponding redundant memory area to replace a failing regular memory area in response to,
    a) detecting the presence of an address for the failing regular memory area previously stored in first storage elements, or
    b) detecting the presence of an activation signal supplied by an error correction circuit; and
  the error correction circuit having second storage elements and configured to, in response to detecting an address for a failing regular memory area stored in the second storage elements, generate the activation signal to cause one of the plurality of redundancy circuits to activate a corresponding redundant memory area.

6. The memory device of claim 5, wherein:
  the activation signal generated by the error correction circuit is provided to a plurality of redundant circuits; and
  each redundancy circuit comprises one or more settable elements that determines whether the redundancy circuit activates the corresponding redundant memory array in response to the activation signal.

7. The memory device of claim 6, wherein the one or more settable elements comprise a plurality of fuse elements.

8. The memory device of claim 6, wherein the one or more settable elements comprises a single fuse element coupled to an inverter to generate an address valid signal to enable activating a corresponding redundant memory area in response to detecting the presence of an address for the failing regular memory area previously stored in first storage elements.

9. The device of claim 6, wherein the one or more settable elements comprise at least one laser fuse.

10. The device of claim 5, wherein the first storage elements comprise laser fuses.

11. The device of claim 10, wherein the second storage elements comprise electrically programmable fuses.

12. A system, comprising:
  a memory device, comprising a plurality of regular memory areas, a plurality of redundant memory areas, and a plurality of redundancy circuits, each having a plurality of laser fuses and configured to activate a corresponding redundant memory area to replace a failing regular memory area in response to detecting an address for the failing regular memory area stored in the laser fuses when a second fuse in a first state, or an activation signal when the second fuse is in a second state; and
  an error correction circuit having a plurality of electrically programmable fuses and configured to, in response to detecting an address for a failing regular memory area stored in the electrically programmable fuses, generate the activation signal to cause one of the plurality of redundancy circuits whose second fuse is in the second state to activate a corresponding redundant memory area.

13. The system of claim 12, wherein the error correction circuit is external to the memory device.

14. The system of claim 12, wherein the activation signal generated by the error correction circuit is provided to a plurality of redundancy circuits.

15. A method for replacing failing regular memory areas of a memory device with redundant memory areas, comprising:
  identifying a failing regular memory area;
  storing an address for the failing regular memory area in first settable memory elements of an error correction circuit configured to generate an activation signal in response to detecting the address stored in the first settable memory elements of the error correction circuit; and
  altering a state of a second settable memory element of a redundancy circuit to a first state, wherein the redundancy circuit is configured to activate a corresponding redundant memory area to replace a failing regular memory area in response to:
    a) a first signal when the second settable memory element of the redundancy circuit is in the first state, wherein the first signal is the activation signal, and
    b) detecting an address for the failing regular memory area stored in third settable elements of the redundancy circuit when the second settable element is in a second state.

16. The method of claim 15, wherein storing the address for the failing regular memory area in settable memory elements of the error correction circuit comprises altering an electrically programmable fuse.

17. The method of claim 15, wherein altering the state of a settable memory element of the redundancy circuit comprises altering an electrically programmable fuse.

18. A method for replacing failing regular memory areas of a memory device with redundant memory areas, comprising:
  during a first test,
    identifying a failing regular memory area, and
    selecting a redundancy circuit for replacing the failing memory area by storing the address of the failing regular memory area in first settable memory elements of the redundancy circuit, where the redundancy circuit activates a corresponding redundant memory area in response to an access to the failing regular memory area; and
  during a second test,
    identifying another failing regular memory area,
    storing an address for the other failing regular memory area in settable memory elements of an error correction circuit, where the error correction circuit generates an activation signal in response to an access to the other failing regular memory area, and
    altering a state of a settable memory element of another redundancy circuit for replacing a failing memory area, where the other redundancy circuit activates a corresponding redundant memory area in response to the activation signal generated by the error correction circuit.

19. The method of claim 18, wherein
storing the address of a failing regular memory area in first settable memory elements, during the first test, comprises cutting laser fuses; and
storing the address for the other failing regular memory area in settable memory elements of the error correction circuit, during the second test, comprises altering electrically programmable fuses.

20. The method of claim 18, wherein:
the first test is performed before the memory device is assembled in a memory module; and
the second test is performed after the memory device is assembled in a memory module.

21. A memory device, comprising:
a plurality of regular memory areas;
a plurality of redundant memory areas;
a plurality of redundancy circuits configured to activate a corresponding redundant memory area to replace a failing regular memory area in response to,
 a) detecting an address for the failing regular memory area stored in the first settable elements when a second settable element is in a first state, or
 b) an activation signal when the second settable element is in a second state; and
an error correction circuit configured to generate the activation signal, in response to detecting an address for a failing regular memory area stored in the third settable elements, to cause one of the plurality of redundancy circuits whose second settable element is in the second state to activate a corresponding redundant memory area.

* * * * *